(12) United States Patent
Lim et al.

(10) Patent No.: US 10,804,215 B2
(45) Date of Patent: Oct. 13, 2020

(54) SEMICONDUCTOR PACKAGE

(71) Applicant: SAMSUNG ELECTRO-MECHANICS CO., LTD., Suwon-si, Gyeonggi-do (KR)

(72) Inventors: Jae Hyun Lim, Suwon-si (KR); Sang Jong Lee, Suwon-si (KR); Chul Kyu Kim, Suwon-si (KR); Yoon Seok Seo, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/418,876

(22) Filed: May 21, 2019

(65) Prior Publication Data

US 2020/0176391 A1 Jun. 4, 2020

(30) Foreign Application Priority Data

Dec. 4, 2018 (KR) .................. 10-2018-0154750

(51) Int. Cl.
*H01L 23/552* (2006.01)
*H01L 23/498* (2006.01)
(Continued)

(52) U.S. Cl.
CPC ........ *H01L 23/552* (2013.01); *H01L 23/3128* (2013.01); *H01L 23/49822* (2013.01);
(Continued)

(58) Field of Classification Search
CPC ........... H01L 23/3121; H01L 23/49816; H01L 23/3135; H01L 23/481; H01L 23/49838; H01L 23/5225; H01L 23/49827; H01L 23/5226; H01L 24/17; H01L 23/585; H01L 23/544; H01L 2224/02379; H01L 2225/06506; H01L 2225/06548; H01L 23/5286; H01L 23/5384; H01L 24/33; H01L 23/28; H01L 23/4952; H01L 23/49872
(Continued)

(56) References Cited

U.S. PATENT DOCUMENTS 10,128,195 B2 * 11/2018 Lin .................. H01L 24/14
2009/0309202 A1 * 12/2009 Hsu ................ H01L 23/5389
257/680
2017/0062360 A1 3/2017 Chang et al.

* cited by examiner

*Primary Examiner* — Theresa T Doan
(74) *Attorney, Agent, or Firm* — Morgan, Lewis & Bockius LLP

(57) ABSTRACT

A semiconductor package comprising: a frame having an opening and including wiring layers and one or more layer of connection vias; a semiconductor chip disposed in the opening and having an active surface having connection pads disposed thereon and an inactive surface opposing the active surface; an encapsulant covering the frame and the semiconductor chip and filling the opening; a connection structure disposed on the frame and the active surface of the semiconductor chip, and including one or more redistribution layers electrically connected to the connection pads and the wiring layers; one or more passive components disposed on the connection structure; a molding material covering each of the passive components; and a metal layer covering outer surfaces of each of the frame, the connection structure, and the molding material. The metal layer is connected to a ground pattern included in the wiring layers of the frame.

20 Claims, 14 Drawing Sheets

(51) Int. Cl.
    *H01L 23/00*       (2006.01)
    *H01L 23/522*      (2006.01)
    *H01L 23/31*       (2006.01)
(52) U.S. Cl.
    CPC .... *H01L 23/49838* (2013.01); *H01L 23/5226* (2013.01); *H01L 24/24* (2013.01); *H01L 24/25* (2013.01); *H01L 2224/24155* (2013.01); *H01L 2224/24265* (2013.01); *H01L 2224/25171* (2013.01)
(58) Field of Classification Search
    USPC .......................................................... 257/659
    See application file for complete search history.

A

B

SEMICONDUCTOR PACKAGE

CROSS-REFERENCE TO RELATED APPLICATION(S)

This application claims benefit of priority to Korean Patent Application No. 10-2018-0154750 filed on Dec. 4, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package.

BACKGROUND

Semiconductor packages have been continuously required to be thinned and lightened in terms of a shape and a weight, and have been required to be implemented in a system in package (SiP) form requiring complexation and multifunctionality in terms of a function. To this end, interest in a technology of mounting a plurality of chips and components in a single package has continuously increased.

Meanwhile, an example of the related art of mounting the plurality of components may include chip-on-board (COB) technology. COB is a method of mounting individual passive components and a semiconductor package on a printed circuit board using surface mount technology (SMT). However, electromagnetic interference (EMI) between the components is large, and electromagnetic waves are radiated to a region in which a metal layer is not present.

SUMMARY

An aspect of the present disclosure may provide a semiconductor package in which process reliability and electromagnetic interference (EMI) blocking performance are improved.

According to an aspect of the present disclosure, a semiconductor package may include: a frame having a through-hole and including a plurality of wiring layers and one or more layer of connection vias electrically connecting the plurality of wiring layers to each other; a semiconductor chip disposed in the through-hole and having an active surface having connection pads disposed thereon and an inactive surface opposing the active surface; an encapsulant covering at least portions of each of the frame and the semiconductor chip and filling at least portions of the through-hole; a connection structure disposed on the frame and the active surface of the semiconductor chip, having a first surface facing the frame and a second surface opposing the first surface, and including one or more redistribution layers electrically connected to the connection pads and the wiring layers; one or more passive components disposed on the second surface of the connection structure and electrically connected to the redistribution layers; a molding material disposed on the second surface of the connection structure and covering at least portions of each of the passive components; and a metal layer covering at least portions of outer surfaces of each of the frame, the connection structure, and the molding material, wherein the metal layer is connected to a ground pattern included in at least one of the plurality of wiring layers of the frame.

According to another aspect of the present disclosure, a semiconductor package may include: a frame having a through-hole and including one or more wiring layers; a semiconductor chip disposed in the through-hole and having an active surface having connection pads disposed thereon and an inactive surface opposing the active surface; an encapsulant covering at least portions of each of the frame and the semiconductor chip and filling at least portions of the through-hole; a connection structure disposed on the frame and the active surface of the semiconductor chip and including one or more redistribution layers electrically connected to the wiring layers; one or more passive components disposed on the connection structure and electrically connected to the redistribution layers; a molding material covering at least portions of each of the connection structure and the passive components; a metal layer covering at least portions of outer surfaces of each of the frame, the connection structure, and the molding material; and multiple metal pattern layers each including a plurality of metal patterns disposed at intervals along a contour of any one of the frame and the connection structure, wherein the plurality of metal patterns included in metal pattern layers disposed on different levels among the multiple metal pattern layers are disposed to be misaligned with each other in a stack direction.

According to another aspect of the present disclosure, a semiconductor package may include: a frame having an opening and including one or more wiring layers; a semiconductor chip disposed in the opening and having an active surface having connection pads disposed thereon and an inactive surface opposing the active surface; an encapsulant covering a portion of the semiconductor chip and filling a portion of the opening; a connection structure disposed on the frame and the active surface of the semiconductor chip, and including one or more redistribution layers electrically connected to the electrode pads and the one or more the wiring layers; a metal layer covering at least portions of outer surfaces of each of the frame and the connection structure; first metal patterns extending between the metal layer and a first ground pattern of one of the one or more wiring layers or the one or more redistribution layers, the first metal patterns spaced apart from each other by first insulating patterns therebetween; and second metal patterns extending between a second ground pattern of another of the one or more wiring layers or the one or more redistribution layers and the metal layer, the second metal patterns spaced apart from each other by second insulating patterns therebetween. The first metal patterns and the second metal patterns are staggered in a plan view along a stacking direction of the connection structure and the semiconductor chip.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
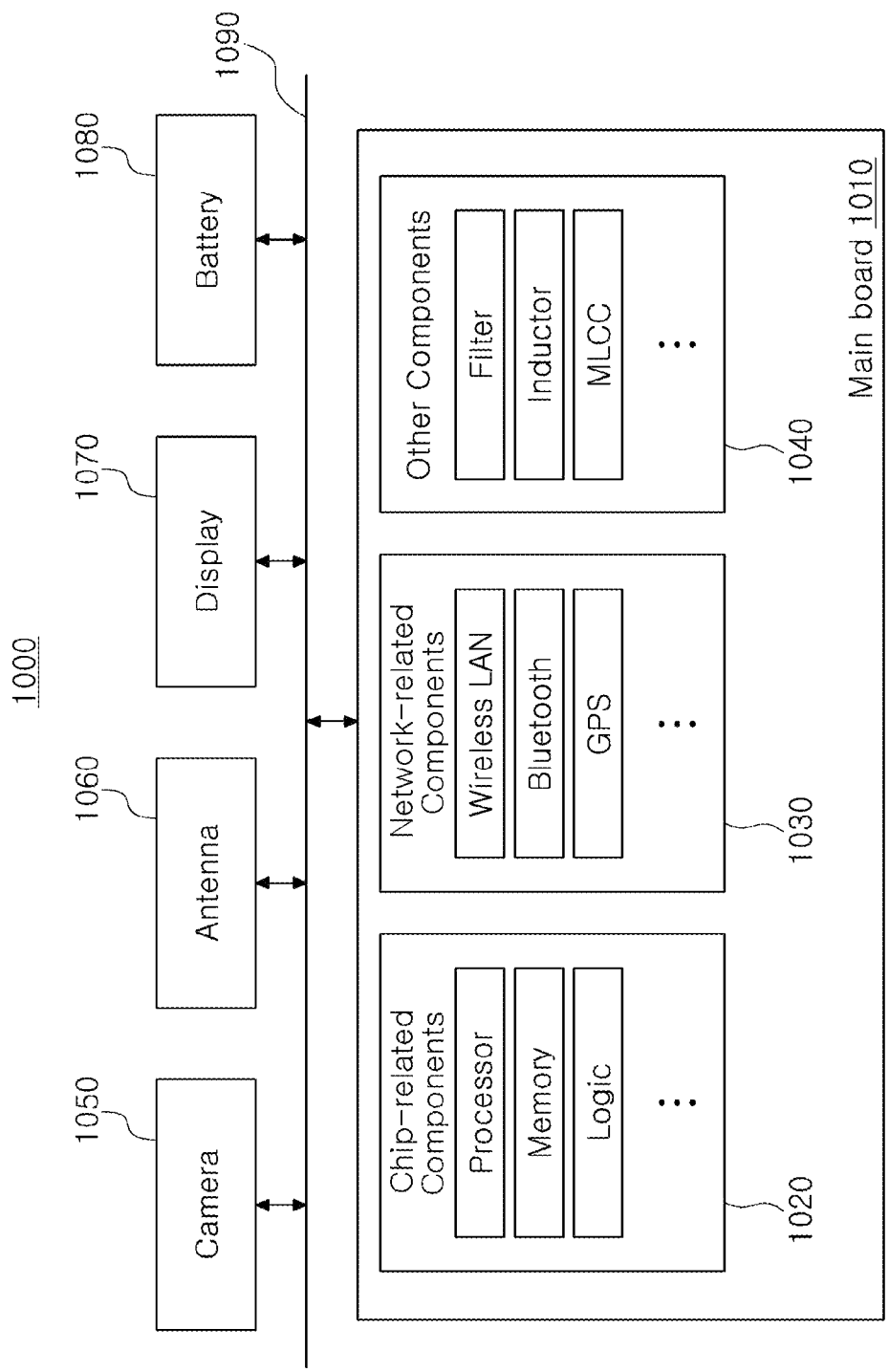
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
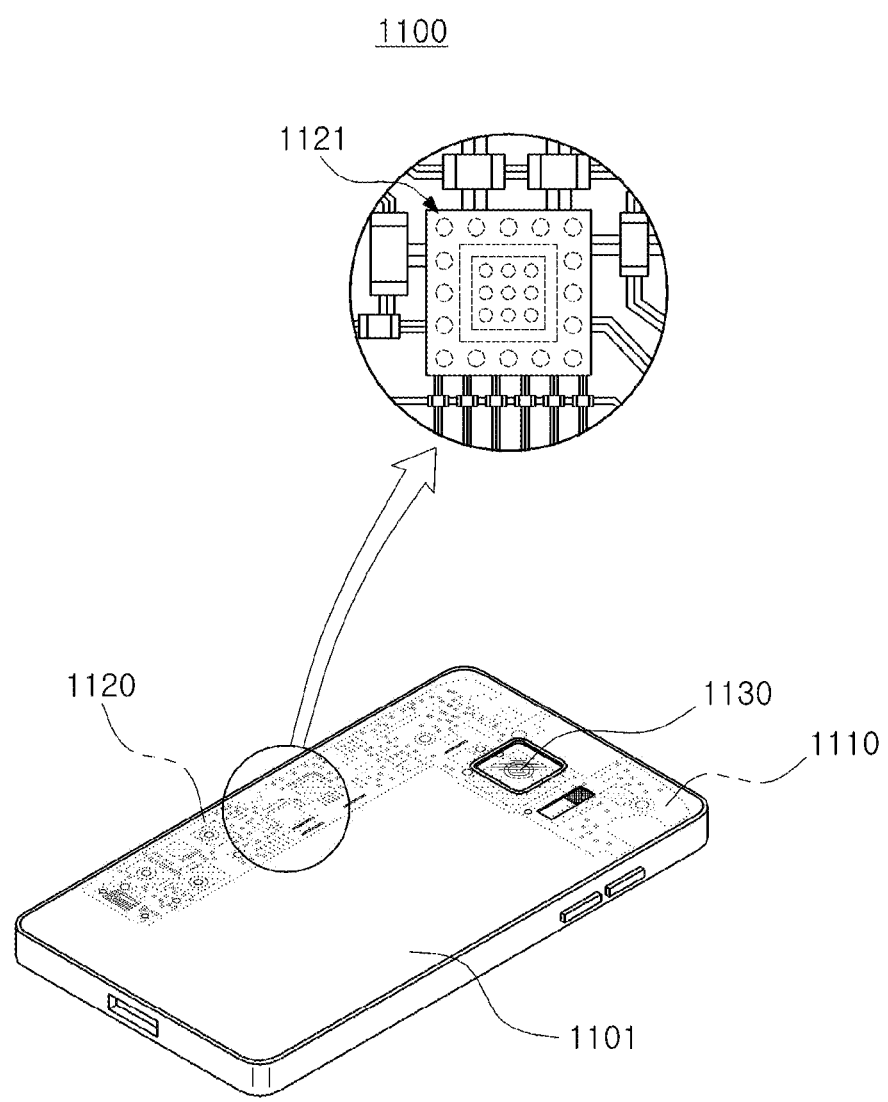
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
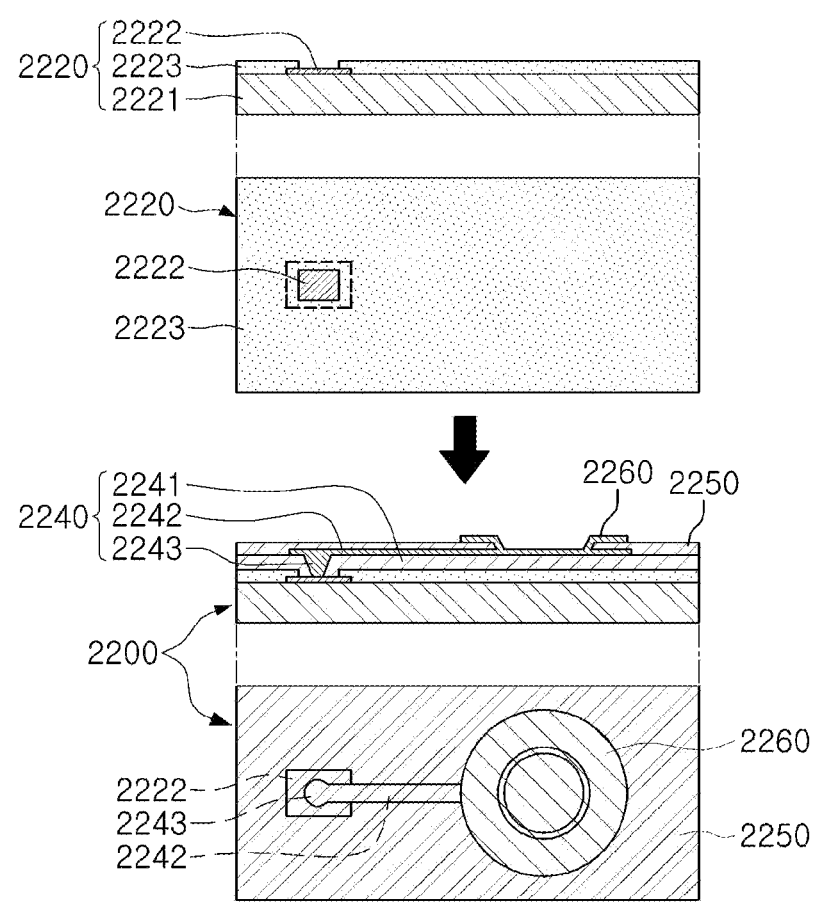
FIGS. 3A and 3B are schematic cross-sectional views illustrating states of a fan-in semiconductor package before and after being packaged.
Figure 3B:
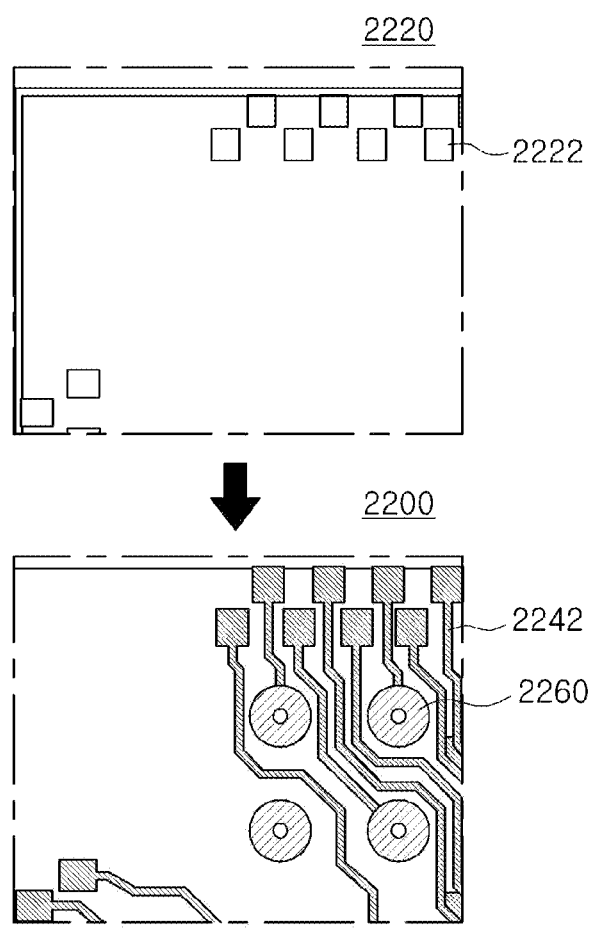

FIGS. 3A and 3B are schematic cross-sectional views illustrating states of a fan-in semiconductor package before and after being packaged.

Figure 4:
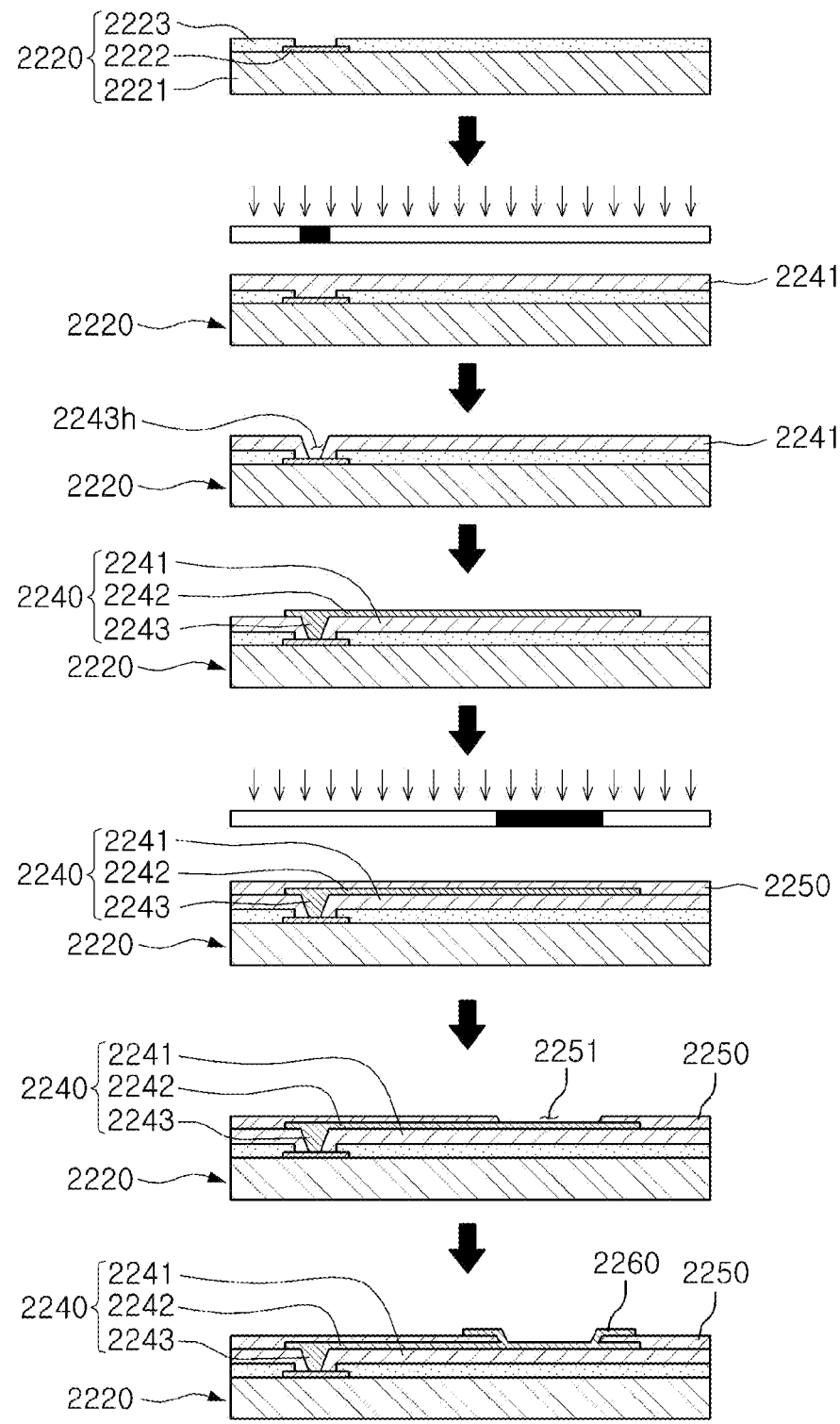
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A through 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID), forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
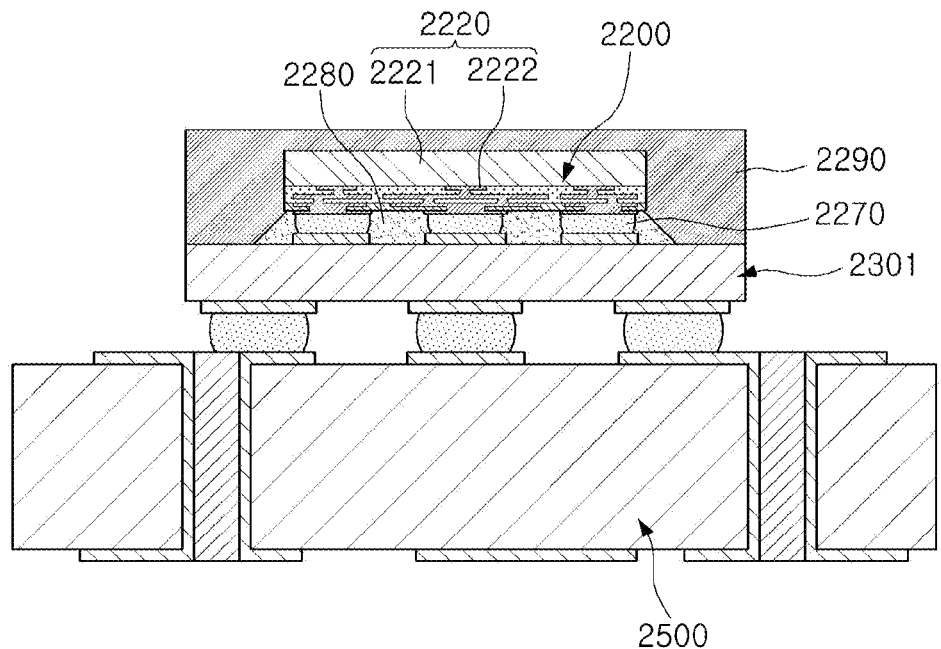
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
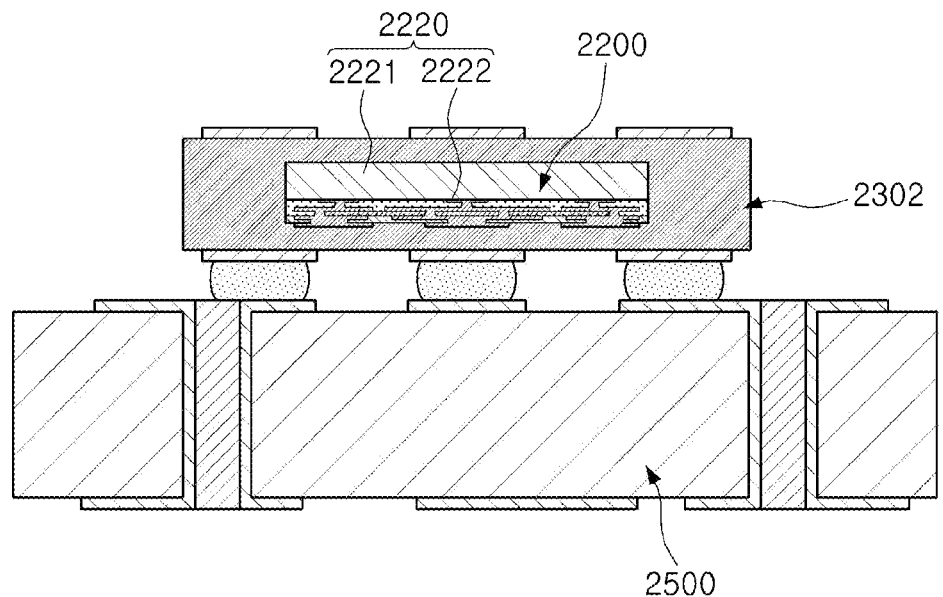
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
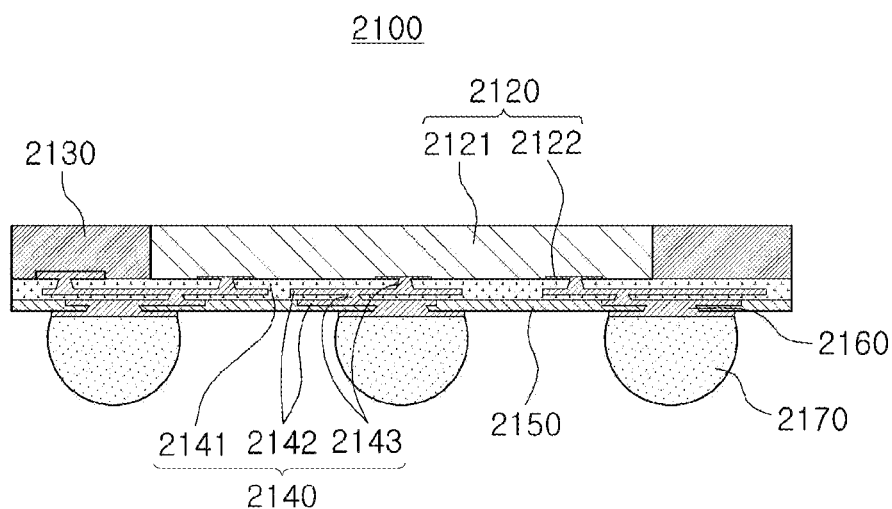
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2202, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
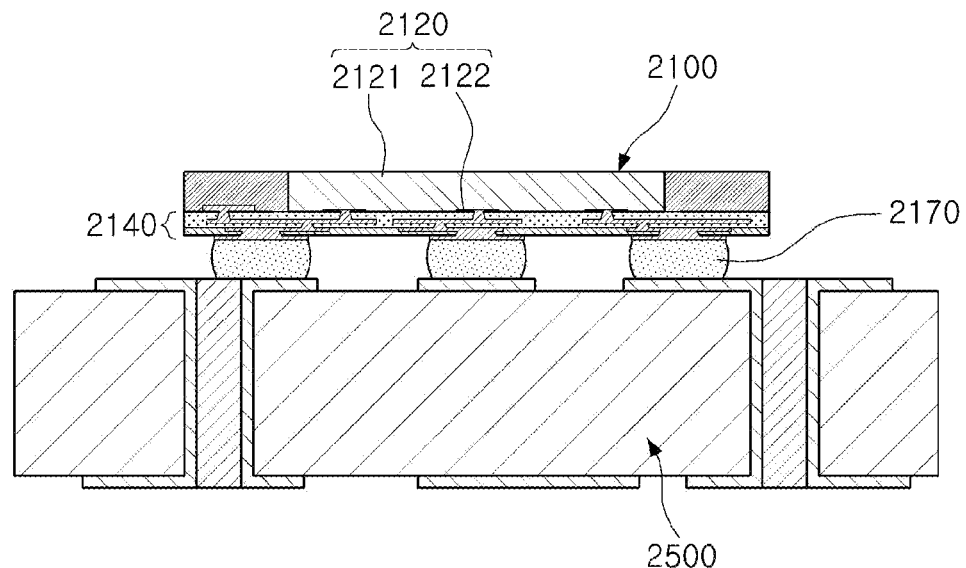
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments in the present disclosure will be described in detail with reference to the drawings.

Figure 9:
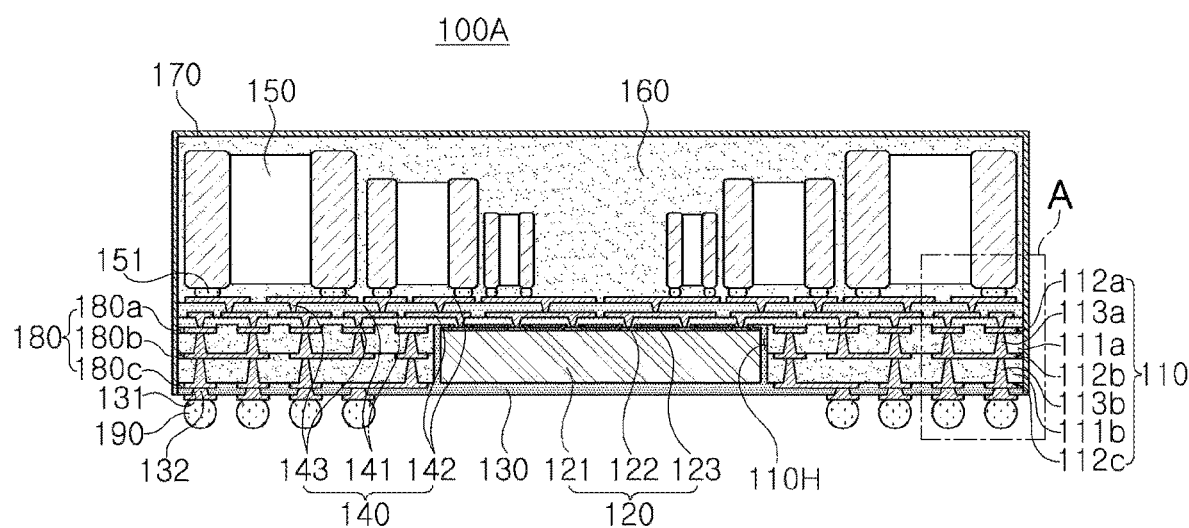
FIG. 9 is a schematic cross-sectional view illustrating a semiconductor package according to an exemplary embodiment in the present disclosure.
Figure 10:
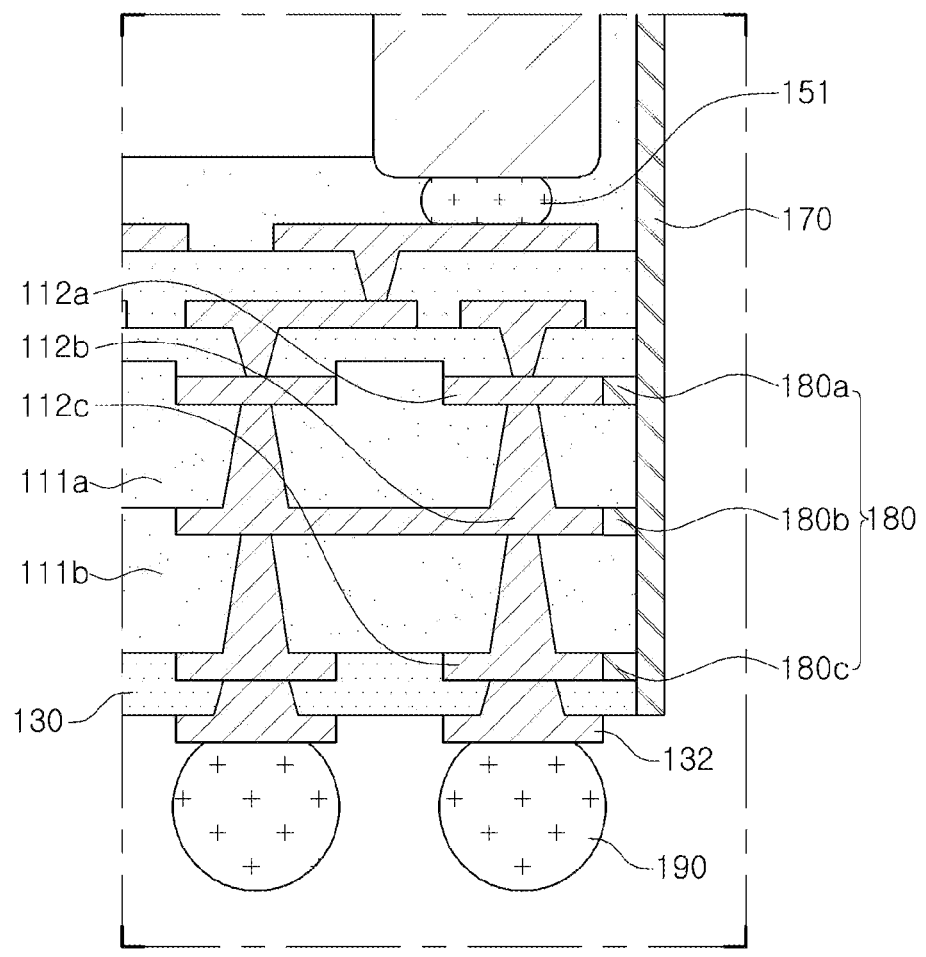
FIG. 10 is an enlarged cross-sectional view of region "A" of the semiconductor package of FIG. 9.
Figure 11:
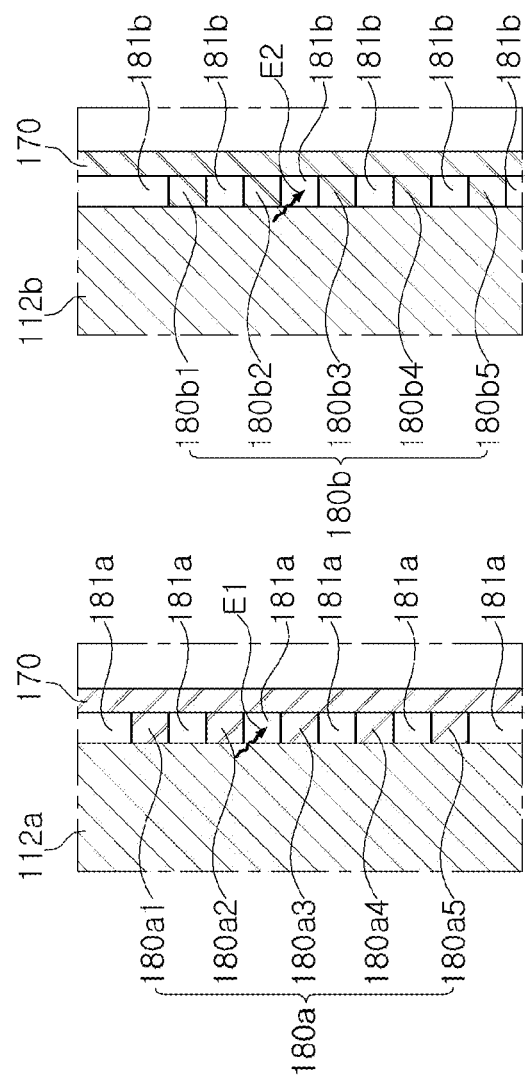
FIGS. 11A and 11B are schematic plan views illustrating metal pattern layers of FIG. 10.
FIG. 11C is a schematic overlay plan view illustrating metal pattern layers of FIGS. 10A and 11B.

FIG. 9 is a schematic cross-sectional view illustrating a semiconductor package according to an exemplary embodiment in the present disclosure, FIG. 10 is an enlarged cross-sectional view of region "A" of the semiconductor package of FIG. 9, FIGS. 11B and 11B are schematic plan views illustrating metal pattern layers of FIG. 10, and FIG.

11C is a schematic overlay plan view illustrating metal pattern layers of FIGS. 10A and 11B.

Referring to FIGS. 9 and 10, a semiconductor package 100A according to an exemplary embodiment in the present disclosure may include a frame 110 having a through-hole 110H and including one or more wiring layers 112, a semiconductor chip 120 disposed in the through-hole 100H and having an active surface having connection pads 122 disposed thereon and an inactive surface opposing the active surface, an encapsulant 130 covering at least portions of each of the frame 110 and the semiconductor chip 120 and filling at least portions of the through-hole 110H, a connection structure 140 disposed on the frame 110 and the active surface of the semiconductor chip 120 and including one or more redistribution layers 142 electrically connected to the connection pads 122 and the one or more wiring layers 112, one or more electronic components 150 disposed on the connection structure 140 and electrically connected to the one or more redistribution layers 142, a molding material 160 disposed on the connection structure 140 and covering at least portions of the one or more electronic components 150, a metal layer 170 covering at least portions of outer surfaces of each of the frame 110, the connection structure 140, and the molding material 160, and multiple metal pattern layers 180 each including a plurality of metal patterns disposed at intervals along a contour of at least one of the frame 110 and the connection structure 140. The plurality of metal patterns included in metal pattern layers 180$a$, 180$b$, and 180$c$ disposed on different levels among the multiple metal pattern layers 180 may be disposed to be misaligned with each other in a stack direction.

In the exemplary embodiment, a semiconductor package including an EMI blocking structure for solving a problem that a portion in which a wiring layer is not formed becomes a radiation path of electromagnetic waves generated in an electronic component mounted in the semiconductor package when the wiring layer is not formed along a contour of the semiconductor package in order to reduce generation of burr on a sidewall of the semiconductor package in a sawing process is disclosed.

In detail, the metal patterns for blocking EMI may be formed along the contour of the semiconductor package, and the plurality of metal patterns may be disposed at intervals to significantly reduce the generation of the burr on the sidewall of the semiconductor package in the sawing process. In addition, the metal patterns may be disposed to be misaligned with metal patterns disposed on the other levels in the stack direction to solve a problem that the electromagnetic waves are radiated to a space the metal patterns.

For example, referring to FIGS. 11A and 11B, according to the exemplary embodiment, a first metal pattern layer 180$a$ and a second metal pattern layer 180$b$ may be disposed along the contour of the frame 110 as the metal pattern layers 180 disposed on different levels, but are not limited thereto. In addition, only the first and second metal pattern layers 180$a$ and 180$b$ are illustrated in FIGS. 11A and 11B in order to briefly represent a misalignment disposition between the metal patterns, but the metal pattern layers 180 may include a third metal pattern layer 180$c$, and may include more metal pattern layers. Electromagnetic waves E1 entering spaces, such as first insulating patterns 181$a$, between first metal patterns 180$a$1, 180$a$2, 180$a$3, 180$a$4, and 180$a$5 of the first metal pattern layer 180$a$ may be externally radiated, and electromagnetic waves E2 entering spaces, such as second insulating patterns 181$b$, between second metal patterns 180$b$1, 180$b$2, 180$b$3, 180$b$4, and 180$b$5 of the second metal pattern layer 180$b$ may also be externally radiated. The first metal patterns 180$a$1, 180$a$2, 180$a$3, 180$a$4, and 180$a$5 having a stripe shape may extend between the metal layer 170 and a ground pattern of the wiring layer 112$a$, and the first metal patterns 180$a$1, 180$a$2, 180$a$3, 180$a$4, and 180$a$5 may be spaced apart from each other by the first insulating patterns 181$a$ therebetween. The second metal patterns 180$b$1, 180$b$2, 180$b$3, 180$b$4, and 180$b$5 having a stripe shape may extend between the metal layer 170 and a ground pattern of the wiring layer 112$b$, and the second metal patterns 180$b$1, 180$b$2, 180$b$3, 180$b$4, and 180$b$5 may be spaced apart from each other by the second insulating patterns 181$b$ therebetween. However, referring to FIG. 11C, the first metal pattern layer 180$a$ and the second metal pattern layer 180$b$ according to the exemplary embodiment may include, respectively, the first metal patterns 180$a$1, 180$a$2, 180$a$3, 180$a$4, and 180$a$5 and the second metal patterns 180$b$1, 180$b$2, 180$b$3, 180$b$4, and 180$b$5 disposed to be misaligned with each other, and thus block radiation paths of the electromagnetic waves E1 and E2 described above. For example, the first metal patterns 180$a$1, 180$a$2, 180$a$3, 180$a$4, and 180$a$5 and the second metal patterns 180$b$1, 180$b$2, 180$b$3, 180$b$4, and 180$b$5 may be staggered in a plan view along a stacking direction of the connection structure 140 and the semiconductor chip 120, as shown in FIG. 11C. The first metal patterns 180$a$1, 180$a$2, 180$a$3, 180$a$4, and 180$a$5 may respectively overlap, or completely overlap, the second insulating patterns 181$b$ in the plan view along the stacking direction, and the second metal patterns 180$b$1, 180$b$2, 180$b$3, 180$b$4, and 180$b$5 may respectively overlap, or completely overlap, the first insulating patterns 181$a$ in the plan view along the stacking direction. Therefore, the generation of the burr on the sidewall of the semiconductor package in the sawing process may be significantly reduced, and the radiation paths of the electromagnetic waves may be effectively blocked.

In addition, in the exemplary embodiment, the multilayer metal pattern layers 180 may electrically connect at least one of the wiring layer 112 and the redistribution layer 142 to the metal layer 170, and in particular, may electrically connect a ground pattern of at least one of the wiring layer 112 and the redistribution layer 142 to the metal layer 170. Therefore, an EMI blocking structure including the metal layer 170, the metal pattern layers 180, and the wiring layer 112 or the redistribution layer 142 may be completed.

In addition, in the exemplary embodiment, the multiple metal pattern layers 180 may include only a plurality of metal patterns disposed along the contour of the frame 110, and the plurality of metal patterns may not be disposed along a contour of the connection structure 140. In this case, a region in which the redistribution layer 142 is not formed may be secured along the contour of the connection structure 140, such that reliability of the sawing process may be secured.

In addition, the plurality of metal patterns included in each of two metal pattern layers 180$a$ and 180$b$ disposed on different levels among the multiple metal pattern layers 180 may not overlap with each other in the stack direction. In this case, the second metal patterns 180$b$1, 180$b$2, 180$b$3, 180$b$4, and 180$b$5 of the second metal pattern layer 180$b$ disposed on a lower level may efficiently block spaces between the first metal patterns 180$a$1, 180$a$2, 180$a$3, 180$a$4, and 180$a$5 discontinuously formed in the first metal pattern layer 180$a$, and a region of metal patterns along the contour of the semiconductor package that may have an influence on the sawing process may be significantly reduced. For example, when the multiple metal pattern layers 180 includes the first metal pattern layer 180$a$ including the first metal patterns

180a1, 180a2, 180a3, 180a4, and 180a5, the second metal pattern layer 180b including the second metal patterns 180b1, 180b2, 180b3, 180b4, and 180b5, and the third metal pattern layer 180c including third metal patterns (not illustrated), which are disposed on different levels, the first metal patterns of the first metal pattern layer 180a may not overlap the second metal patterns of the second metal pattern layer 180b in the stack direction, the second metal patterns of the second metal pattern layer 180b may not overlap the third metal patterns of the third metal pattern layer 180c in the stack direction, and the third metal patterns of the third metal pattern layer 180c may not overlap the first metal patterns of the first metal pattern layer 180a in the stack direction.

In addition, although not illustrated in FIGS. 9 through 11C in order to clearly represent a relationship between the wiring layers, the metal pattern layers, and the metal layer, a thickness (in the stacking direction) of each of the multilayer metal pattern layers 180 may be greater than that of the metal layer 170. The reason is that the metal layer 170 covering an outer surface of the semiconductor package is thinned by a sputtering process, or the like, while the metal pattern layers 180 connected to the wiring layer 112, or the like, are formed by a plating process.

Meanwhile, a semiconductor package according to another exemplary embodiment in the present disclosure may include one or ore metal pattern layers 180 disposed at intervals along a contour of the frame 110 and each including a plurality of metal patterns electrically connecting the wiring layer 112 to the metal layer 170. In this case, the metal pattern layers 180 are not formed along the contour of the connection structure 140, such that the generation of the burr may further be reduced, and an EMI blocking structure including the metal layer 170, the metal pattern layers 180, and the wiring layer 112 may be completed by electrically connecting the metal patterns to the wiring layer.

The respective components included in the semiconductor package 100A according to the exemplary embodiment will hereinafter be described below in more detail.

The frame 110 may further improve rigidity of the semiconductor package 100A depending on certain materials, and serve to secure uniformity of a thickness of the encapsulant 130. The frame 110 may have at least one through-hole 110H. The through-hole 110H may penetrate through the frame 110, and the semiconductor chip 120 may be disposed in the through-hole 110H. The semiconductor chip 120 may be disposed to be spaced apart from walls of the through-hole 110H by a predetermined distance, and may be surrounded by the walls of the through-hole 110H. However, such a form is only an example and may be variously modified to have other forms, and the frame 110 may perform another function depending on such a form. The frame 110 may be omitted, if necessary, but it may be more advantageous in securing board level reliability intended in the present disclosure that the semiconductor package 100A includes the frame 110.

Since the frame 110 may include a large number of wiring layers 112a, 112b, and 112c, the connection structure 140 may further be simplified. Therefore, a decrease in a yield depending on a defect occurring in a process of forming the connection structure 140 may be suppressed. For example, the frame 110 may include a first insulating layer 111a in contact with the connection structure 140, a first wiring layer 112a in contact with the connection structure 140 and embedded in the first insulating layer 111a, a second wiring layer 112b disposed on a lower surface of the first insulating layer 111a, the other surface of the first insulating layer 111a opposing one surface of the first insulating layer 111a in which the first wiring layer 112a is embedded, a second insulating layer 111b disposed on the lower surface of the first insulating layer 111a and covering the second wiring layer 112b, a third wiring layer 112c disposed on a lower surface of the second insulating layer 111b, first connection vias 113a penetrating through the first insulating layer 111a and connecting the first and second wiring layers 112a and 112b to each other, and second connection vias 113b penetrating through the second insulating layer 111b and connecting the second and third wiring layers 112b and 112c to each other. Since the first wiring layer 112a is embedded in the first insulating layer 111a, an insulating distance of an insulating layer 141 of the connection structure 140 may be substantially constant.

A material of each of the insulating layers 111a and 111b is not particularly limited. For example, a thermosetting resin such as an epoxy resin, a thermoplastic resin such as a polyimide resin, or a resin including a reinforcing material such as an inorganic filler, for example, silica, alumina, or the like, more specifically, an Ajinomoto Build up Film (ABF), FR-4, Bismaleimide Triazine (BT), a photoimagable dielectric (PID) resin, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may be used. In this case, excellent rigidity of the semiconductor package 100A may be maintained, such that the frame 110 may be used as a kind of support member. The first insulating layer 111a and the second insulating layer 111b may include the same insulating material, and a boundary between the first insulating layer 111a and the second insulating layer 111b may not be apparent. However, the first insulating layer 111a and the second insulating layer 111b are not limited thereto.

The wiring layers 112a, 112b, and 112c may serve to redistribute the connection pads 122 of the semiconductor chip 120, and a material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, connection terminal pads, and the like. As a non-restrictive example, all of the wiring layers 112a, 112b, and 112c may include ground patterns. In this case, the number of ground patterns formed on the redistribution layers 142 of the connection structure 140 may be significantly reduced, and a degree of freedom of a wiring design may thus be improved.

A surface treatment layer (not illustrated) may be further formed on portions of the wiring layer 112c exposed from through openings 131 formed in the encapsulant 130 among the wiring layers 112a, 112b, and 112c. The surface treatment layer (not illustrated) is not particularly limited as long as it is known in the related art, and may be formed by, for example, electrolytic gold plating, electroless gold plating, organic solderability preservative (OSP) or electroless tin plating, electroless silver plating, electroless nickel plating/ substituted gold plating, direct immersion gold (DIG) plating, hot air solder leveling (HASL), or the like. Thicknesses of the wiring layers 112a, 112b, and 112c of the frame 110 may be greater than those of the redistribution layers 142 of the connection structure 140. The reason is that the frame 110 may have a thickness similar to that of the semiconductor chip 120, while the connection structure 140 needs to be thinned, and is that processes to make the frame 110 and the connection structure 140 are different from each other.

The connection vias 113a and 313b may electrically connect the wiring layers 112a, 112b, and 112c formed on different layers to each other, resulting in an electrical path in the frame 110. A material of each of the connection vias 113a and 113b may be a conductive material. Each of the connection vias 113a and 113b may be completely filled with the conductive material, or the conductive material may be formed along a wall of each of connection via holes. In addition, each of the connection vias 113a and 113b may have any shape known in the related art, such as a tapered shape, a cylindrical shape, and the like. Meanwhile, when holes for the first connection vias 113a are formed, some of the pads of the first wiring layer 112a may serve as a stopper, and when holes for the second connection vias 113b are formed, some of the pads of the second wiring layer 112b may serve as a stopper. Therefore, it may thus be advantageous in a process that each of the first and second connection vias 113a and vias 113b has the tapered shape of which a width of a lower surface is greater than that of an upper surface. In this case, the first connection vias 113a may be integrated with portions of the second wiring layer 112b, and the second connection vias 113b may be integrated with portions of the third wiring layer 112c.

The semiconductor chip 120 may be an integrated circuit (IC) provided in an amount of several hundred to several million or more elements integrated in a single chip. The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. The active surface of the semiconductor chip 120 refers to a surface of the semiconductor chip 120 on which the connection pads 122 are disposed, and the inactive surface of the semiconductor chip 120 refers to a surface of the semiconductor chip 120 opposing the active surface. A passivation layer 123 covering at least portions of the connection pads 122 may be formed on the body 121, if necessary. The passivation layer 123 may be an oxide layer, a nitride layer, or the like, or be a double layer of an oxide layer and a nitride layer. An insulating layer (not illustrated), and the like, may further be disposed in other required positions. The semiconductor chip 120 may be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an ADC converter, an ASIC, or the like, but is not necessarily limited thereto.

The encapsulant 130 may fill at least portions of the through-hole 110H and encapsulate the semiconductor chip 120. An encapsulation form of the encapsulant 130 is not particularly limited, and may be a form in which the encapsulant 130 surrounds at least portions of the semiconductor chip 120. For example, the encapsulant 130 may cover at least portions of the frame 110 and the inactive surface of the semiconductor chip 120, and fill at least portions of spaces between the walls of the through-hole 110H and the side surfaces of the semiconductor chip 120. Meanwhile, the encapsulant 130 may fill the through-hole 110H to thus serve as an adhesive for fixing the semiconductor chip 120 and reduce buckling of the semiconductor chip 120 depending on certain materials. The encapsulant 130 may include an insulating material. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. Alternatively, an epoxy molding compound (EMC), a photoimagable encapsulant (PIE), or the like, may be used as the insulating material. Alternatively, a material in which an insulating resin such as a thermosetting resin or a thermoplastic resin is impregnated in an inorganic filler and/or a core material such as a glass fabric may also be used as the insulating material.

Several tens to several hundreds of connection pads 122 of the semiconductor chip 120 having various functions may be redistributed by the connection structure 140, and may be physically and/or electrically connected to the electronic components 150. The connection structure 140 may include a first insulating layer 141 disposed on the frame 110 and the active surface of the semiconductor chip 120, a first redistribution layer 142 disposed on the first insulating layer 141, first redistribution vias 143 connecting the first redistribution layer 142 and a frame metal layer 115 (see FIG. 15) to each other or connecting the first redistribution layer 142 and the connection pads 122 of the semiconductor chip 120, a second insulating layer 141 disposed on the first insulating layer 141, a second redistribution layer 142 disposed on the second insulating layer 141, and second redistribution vias 143 penetrating through the second insulating layer 141 and connecting the first and second redistribution layers 142 to each other. The connection structure 140 may include insulating layers, redistribution layers, and redistribution vias of which the numbers are more than those illustrated in the drawings.

A material of each of the insulating layers 141 may be an insulating material. In this case, a photosensitive insulating material such as a PID resin may also be used as the insulating material. That is, each of a plurality of insulating layers 141 may be a photosensitive insulating layer. When the insulating layer 141 has photosensitive properties, the insulating layer 141 may be formed to have a smaller thickness, and a fine pitch of the redistribution via 143 may be achieved more easily. Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent. The number of insulating layers may be more than that illustrated in the drawing.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) pattern layers (not illustrated), and may further include power (PWR) patterns, signal (S) patterns, and the like. Here, the signal (S) patterns may include various signals such as data signals, or the like except for ground (GND) signals, power (PWR) signals, or the like. In addition, the redistribution layers 142 may include via pad patterns. Although not obviously illustrated in the drawing, the number of redistribution layers 142 may be more than or less than that illustrated in the drawing.

The redistribution vias 143 may electrically connect the redistribution layers 142 formed on different layers to each other, the connection pads 122, the first wiring layer 112a and the like, resulting in an electrical path in the semiconductor package 100A. A material of each of the redistribution vias 143 may be a conductive material such as copper (Cu), aluminum (Al), silver (Ag), tin (Sn), gold (Au), nickel (Ni), lead (Pb), titanium (Ti), or alloys thereof. Each of the redistribution vias 143 may be completely filled with the conductive material or the conductive material may be formed along a wall of each of via holes. In addition, each of the redistribution vias 143 may have any shape known in the related art, such as a tapered shape, a cylindrical shape, and the like.

The electronic components 150 may be various active components and/or passive components. That is, the electronic components 150 may be integrated circuits (IC) or may be passive components such as capacitors or inductors. The electronic components 150 may be the same kind of components or may be different kinds of components. The respective electronic components 150 may be mounted on the connection structure 140 through low melting point metals 151 and be electrically connected to the redistribution layers 142 through low melting point metals 151. The low melting point metal 151 refer to a metal such as tin (Sn) having a melting point lower than that of copper (Cu), and may be, for example, a solder bump, or the like. At least one of the electronic components 150 may be disposed in a region in the active surface of the semiconductor chip 120 when viewed in a direction toward the active surface of the semiconductor chip 120. That is, the electronic components 150 may be mounted in most of the regions on the connection structure 140. In addition, since the electronic components 150 are directly mounted on the connection structure 140, when a plurality of electronic components 150 are mounted, an interval between the electronic components 150, for example, an interval between the passive components may be significantly reduced, such that a mounting density may be improved. Meanwhile, an underfill resin (not illustrated) may be disposed between the connection structure 140 and the molding material 160 to serve to bond the connection structure 140 and the molding material 160 to each other, and may embed the low melting point metal 151 therein to serve to more effectively mount and fix the electronic components 150 on and to the connection structure 140.

The electronic components 150 may be, for example, passive components such as capacitors such as multilayer ceramic capacitors (MLCCs) or low inductance chip capacitors (LICCs), inductors such as power inductors, beads, or the like. The electronic components 150 may have different sizes and thicknesses. In addition, each of the electronic components 150 may have a thickness different from that of the semiconductor chip 120. The number of electronic components 150 is not particularly limited, and may be more than or less than that illustrated in the drawing.

The molding material 160 may encapsulate at least portions of upper surfaces of the one or more electronic components 150 and the connection structure 140. An encapsulation form of the molding material 160 is not particularly limited, and may be a form in which the molding material 160 surrounds at least portions of the passive components 150 on the connection structure 140. The molding material 160 may cover at least portions of upper and lower surfaces and side surfaces of the passive components 150. The molding material 160 may extend onto the connection structure 140 to be disposed on the connection structure 140, and may be in contact with an upper surface of the redistribution layer 142 in contact with the low melting point metals 151. The molding material 160 may include a material that is the same as or different from that of the encapsulant 130.

The metal layer 170 may cover an upper surface and side surfaces of the molding material 160, and extend to side surfaces of the connection structure 140 and the frame 110. The metal layer 170 may be connected to the redistribution layers 142 in a region that is not illustrated to receive a ground signal applied from the connection structure 140, and is not limited thereto. An EMI blocking function of the semiconductor package 100A may further be improved by the metal layer 170. The metal layer 170 may include a metal material. Here, the metal material may be, for example, copper (Cu), aluminum (Al), silver (Ag), tin (Sn), gold (Au), nickel (Ni), lead (Pb), titanium (Ti), or alloys thereof.

Underbump metals 132 may improve connection reliability of electrical connection metals 190 to improve board level reliability of the semiconductor package 100A. The underbump metals 132 may be connected to the second wiring layer 112b through the openings 131 of the encapsulant 130 on a lower surface of the frame 110. The underbump metals 132 may be formed in the openings 131 by a metallization method using a conductive material such as a metal, but are not limited thereto.

The electrical connection metals 190 may physically or electrically externally connect the semiconductor package 100A. For example, the semiconductor package 100A may be mounted on the mainboard of the electronic device through the electrical connection metals 190. Each of the electrical connection metals 190 may be formed of a low melting point metal, for example, a solder such as an alloy including tin (Sn), more specifically, a tin (Sn)-aluminum (Al)-copper (Cu) alloy, or the like. However, this is only an example, and a material of each of the electrical connection metals 190 not particularly limited thereto. Each of the electrical connection metals 190 may be a land, a ball, a pin, or the like. The electrical connection metals 190 may be formed as a multilayer or single layer structure. When the electrical connection metals 190 are formed as a multilayer structure, the electrical connection metals 190 may include a copper (Cu) pillar and a solder. When the electrical connection metals 190 are formed as a single layer structure, the electrical connection metals 190 may include a tin-silver solder or copper (Cu). However, this is only an example, and the electrical connection metals 190 are not limited thereto. The number, an interval, a disposition form, and the like, of electrical connection metals 190 are not particularly limited, but may be sufficiently modified depending on design particulars by those skilled in the art. For example, the electrical connection metals 190 may be provided in an amount of several tens to several thousands, or may be provided in an amount of several tens to several thousands or more or several tens to several thousands or less.

At least one of the electrical connection metals 190 may be disposed in a fan-out region of the semiconductor chip 120. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 12:
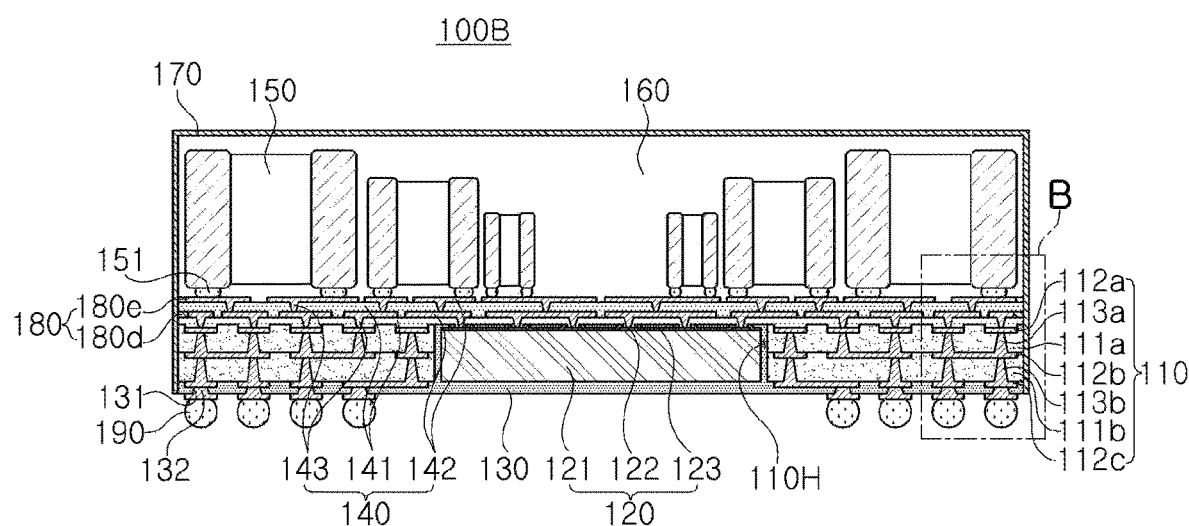
FIG. 12 is a schematic cross-sectional view illustrating a semiconductor package according to another exemplary embodiment in the present disclosure.
Figure 13:
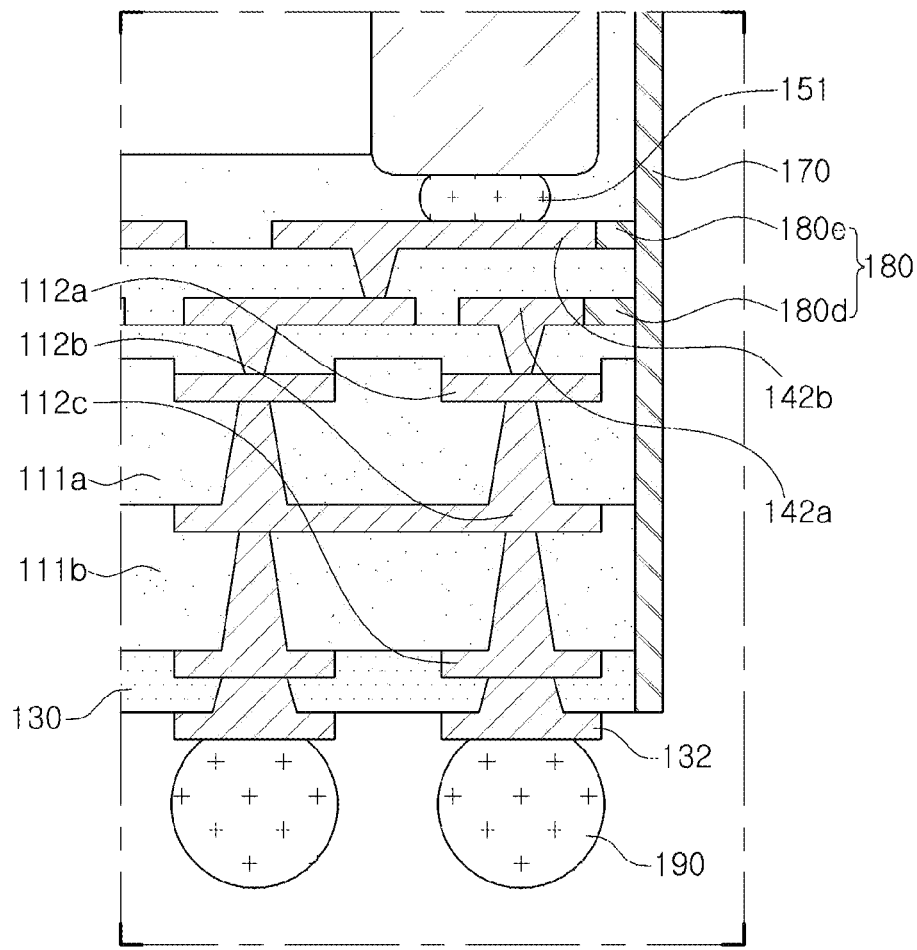
FIG. 13 is an enlarged cross-sectional view of region "B" of the semiconductor package of FIG. 12.
Figure 14:
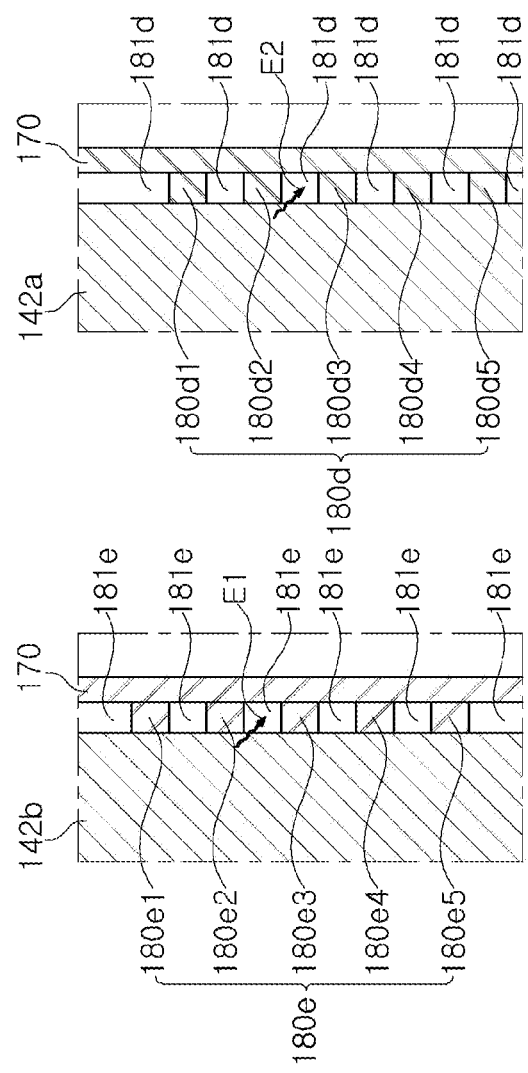
FIGS. 14A and 14B are schematic plan views illustrating metal pattern layers of FIG. 13.
FIG. 14C is a schematic overlay plan view illustrating metal pattern layers of FIGS. 14A and 14B.

FIG. 12 is a schematic cross-sectional view illustrating a semiconductor package according to another exemplary embodiment in the present disclosure, FIG. 13 is an enlarged cross-sectional view of region "B" of the semiconductor package of FIG. 12, FIGS. 14A and 14B are schematic plan views illustrating metal pattern layers of FIG. 13, and FIG. 14C is a schematic overlay plan view illustrating metal pattern layers of FIGS. 14A and 14B.

Referring to FIGS. 12 and 13, in a semiconductor package 100B according to another exemplary embodiment, multiple metal pattern layers 180e and 180d may include only a plurality of metal patterns disposed along a contour of a connection structure 140, and the plurality of metal patterns may not be disposed along a contour of a frame 110. In this case, a region in which wiring layers 112a, 112b, and 112c are formed may be secured along the contour of the frame 110, such that reliability of a sawing process may be secured. In this case, as illustrated in FIG. 13, a fourth metal pattern layer 180d may be electrically connected to a first redistribution layer 142a, and a fifth metal pattern layer 180e may be electrically connected to a second redistribution layer 142b. The number of redistribution layers 142 may be more than that illustrated in the drawing, and the number of metal pattern layers 180 corresponding to the redistribution layers 142 may also be more than illustrated in the drawing.

Referring to FIGS. 14A and 14B, according to another exemplary embodiment, the fourth metal pattern layer 180d and the fifth metal pattern layer 180e, metal pattern layers 180 disposed on different levels, may be disposed along the contour of the connection structure 140, but are not limited thereto, and redistribution layers 142 corresponding to the fourth metal pattern layer 180d and the fifth metal pattern layer 180e may be divided into the first redistribution layer 142a and the second redistribution layer 142b in order to clearly represent a misalignment disposition between the fourth metal pattern layer 180d and the fifth metal pattern layer 180e. Electromagnetic waves E1 entering spaces, such as fifth insulating patterns 181e, between fifth metal patterns 180e1, 180e2, 180e3, 180e4, and 180e5 of the fifth metal pattern layer 180e may be externally radiated, and electromagnetic waves E2 entering spaces, such as fourth insulating patterns 181d, between fourth metal patterns 180d1, 180d2, 180d3, 180d4, and 180d5 of the fourth metal pattern layer 180d may be externally radiated. The fifth metal patterns 180e1, 180e2, 180e3, 180e4, and 180e5 having a stripe shape may extend between the metal layer 170 and a ground pattern of the second redistribution layer 142b, and the fifth metal patterns 180e1, 180e2, 180e3, 180e4, and 180e5 may be spaced apart from each other by the fifth insulating patterns 181e therebetween. The fourth metal patterns 180d1, 180d2, 180d3, 180d4, and 180d5 having a stripe shape may extend between the metal layer 170 and a ground pattern of the first wiring layer 142a, and the fourth metal patterns 180d1, 180d2, 180d3, 180d4, and 180d5 may be spaced apart from each other by the fourth insulating patterns 181d therebetween. However, referring to FIG. 14C, the fourth metal pattern layer 180d and the fifth metal pattern layer 180e may include, respectively, the fourth metal patterns 180d1, 180d2, 180d3, 180d4, and 180d5 and the fifth metal patterns 180e1, 180e2, 180e3, 180e4, and 180e5 disposed to be misaligned with each other, and thus block radiation paths of the electromagnetic waves E1 and E2 described above. For example, the fifth metal patterns 180e1, 180e2, 180e3, 180e4, and 180e5 and the fourth metal patterns 180d1, 180d2, 180d3, 180d4, and 180d5 may be staggered in a plan view along a stacking direction of the connection structure 140 and the semiconductor chip 120, as shown in FIG. 14C. The fifth metal patterns 180e1, 180e2, 180e3, 180e4, and 180e5 may respectively overlap, or completely overlap, the fourth insulating patterns 181d in the plan view along the stacking direction, and the fourth metal patterns 180d1, 180d2, 180d3, 180d4, and 180d5 may respectively overlap, or completely overlap, the fifth insulating patterns 181e in the plan view along the stacking direction. A description, or the like, of other configurations overlaps that described above, and is thus omitted. Although not shown, the fourth metal patterns 180d1, 180d2, 180d3, 180d4, and 180d5 and the fourth insulating patterns 181d therebetween, and the first metal patterns 180a1, 180a2, 180a3, 180a4, and 180a5 and the first insulating patterns 181a therebetween, may form an overlap view similar to that shown in FIG. 11C or 14C, although the present disclosure is not limited thereto.

Figure 15:
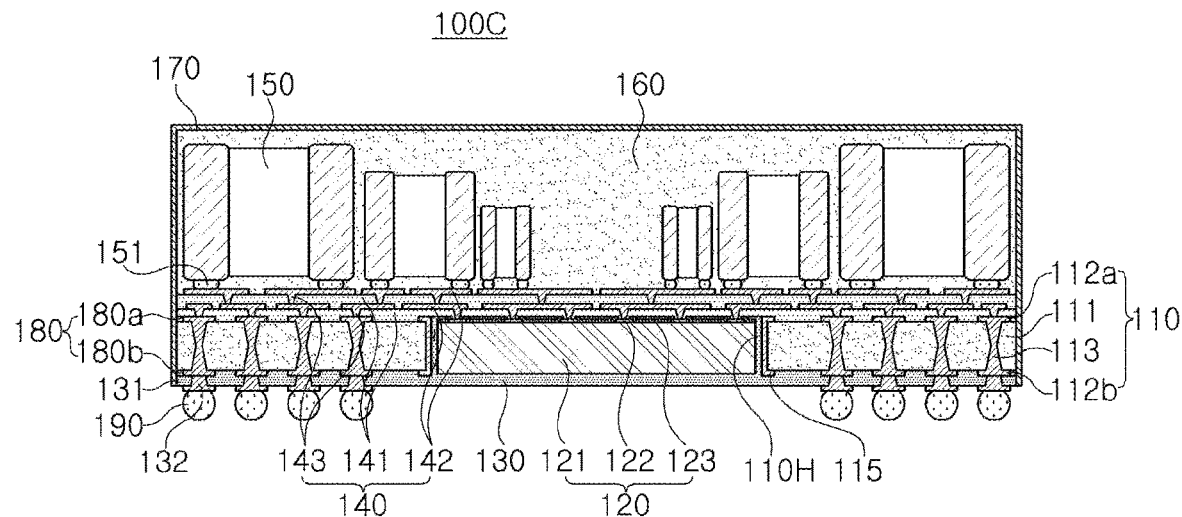
FIG. 15 is a schematic cross-sectional view illustrating a semiconductor package according to another exemplary embodiment in the present disclosure.

FIG. 15 is a schematic cross-sectional view illustrating a semiconductor package according to another exemplary embodiment in the present disclosure.

Referring to FIG. 15, in a semiconductor package 100C according to another exemplary embodiment, wiring layers 112 of a frame 110 may be formed on upper and lower surfaces of the frame 110, respectively, unlike the semiconductor package 100A of FIG. 9. For example, the frame 110 may include a first insulating layer 111, a first wiring layer 112a disposed on an upper surface of the first insulating layer 111, a second wiring layer 112b disposed on a lower surface of the first insulating layer 111, first connection vias 113 penetrating through the first insulating layer 111 and connecting the first and second wiring layers 112a and 112b to each other, and a frame metal layer 115 disposed on inner sidewalls of a through-hole 110H.

The first connection vias 113 may penetrate through the insulating layer 111 and electrically connect the first wiring layer 112a and the second wiring layer 112b to each other. A material of each of the first connection vias 113 may be the conductive material described above. Each of the first connection vias 113 may be completely filled with the conductive material, or the conductive material may be formed along a wall of each of connection via holes. Each of the first connection vias 113 may be a through-connection-via completely penetrating through the insulating layer 111, and may have a cylindrical shape or an hourglass shape, but is not limited thereto.

The frame metal layer 115 may be disposed on upper and lower surfaces of the first insulating layer 111 and the inner sidewalls of the through-hole 110H. The frame metal layer 115 may be disposed to surround a semiconductor chip 120. The frame metal layer 115 may be introduced in order to improve an EMI blocking effect and a heat dissipation effect of the semiconductor chip 120. The frame metal layer 115 may include a conductive material such as copper (Cu), aluminum (Al), silver (Ag), tin (Sn), gold (Au), nickel (Ni), lead (Pb), titanium (Ti), or alloys thereof. The frame metal layer 115 may be formed by a plating process, and may include a seed layer and a conductor layer. The frame metal layer 115 may be used as a ground. In this case, the frame metal layer 115 may be electrically connected to ground patterns in a connection structure 140. According to exemplary embodiments, the frame metal layer 115 may be omitted in the semiconductor package. A description, or the like, of other configurations overlaps that described above, and is thus omitted.

Figure 16:
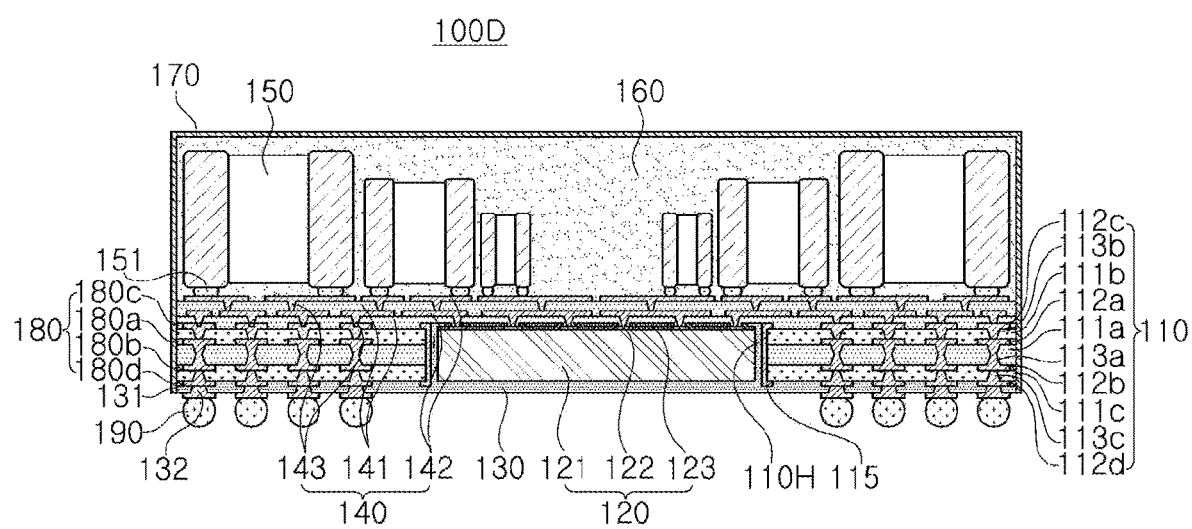
FIG. 16 is a schematic cross-sectional view illustrating a semiconductor package according to another exemplary embodiment in the present disclosure.

FIG. 16 is a schematic cross-sectional view illustrating a semiconductor package according to another exemplary embodiment in the present disclosure.

Referring to FIG. 16, in a semiconductor package 100D according to another exemplary embodiment, a frame 110 may include a larger number of wiring layers 112a, 112b, 112c, and 112d, unlike the semiconductor package 100C of FIG. 15. For example, the frame 110 may further include a second insulating layer 111b disposed on an upper surface of the first insulating layer 111a and covering the first wiring layer 112a, a third wiring layer 112c disposed on the second insulating layer 111b, a third insulating layer 111c disposed on the lower surface of the first insulating layer 111a and covering the second wiring layer 112b, a fourth wiring layer 112d disposed on the third insulating layer 111c, second connection vias 113b penetrating through the second insulating layer 111b and connecting the first and third wiring layers 112a and 112c to each other, and third connection vias 113c penetrating through the third insulating layer 111c and connecting the second and fourth wiring layers 112b and 112d to each other. The first to fourth wiring layers 112a, 112b, 112c, and 112d may be electrically connected to connection pads 122, electronic components 150, and the like. Since the frame 110 may include the large number of wiring layers 112a, 112b, 112c, and 112d, a connection structure 140 may further be simplified. Therefore, a decrease in a yield depending on a defect occurring in a process of forming the connection structure 140 may be suppressed.

Although not illustrated in the drawing, the first insulating layer 111a may have a thickness greater than that of each of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first connection via 113a penetrating through the first insulating layer 111a may have a diameter greater than those of the second and third connection vias 113b and 113c each penetrating through the second and third insulating layers 111b and 111c.

The first wiring layer 112a and the second wiring layer 112b of the frame 110 may be disposed on a level between an active surface and an inactive surface of the semiconductor chip 120. Since the frame 110 may be formed at a thickness corresponding to that of the semiconductor chip 120, the first wiring layer 112a and the second wiring layer 112b formed in the frame 110 may be disposed on the level between the active surface and the inactive surface of the semiconductor chip 120. Thicknesses of the wiring layers 112a, 112b, 112c, and 112d of the frame 110 may be greater than those of redistribution layers 142 of the connection structure 140. A description of other configurations overlaps that described above, and is thus omitted.

As set forth above, according to an exemplary embodiment in the present disclosure, a semiconductor package in which a defect occurring in a process of sawing the semiconductor package is significantly reduced and an EMI blocking effect is improved may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a frame having a through-hole and including a plurality of wiring layers and one or more layer of connection vias electrically connecting the plurality of wiring layers to each other;
a semiconductor chip disposed in the through-hole and having an active surface having connection pads disposed thereon and an inactive surface opposing the active surface;
an encapsulant covering at least portions of each of the frame and the semiconductor chip and filling at least portions of the through-hole;
a connection structure disposed on the frame and the active surface of the semiconductor chip, having a first surface facing the frame and a second surface opposing the first surface, and including one or more redistribution layers electrically connected to the connection pads and the wiring layers;
one or more passive components disposed on the second surface of the connection structure and electrically connected to the redistribution layers;
a molding material disposed on the second surface of the connection structure and covering at least portions of each of the passive components; and
a metal layer covering at least portions of outer surfaces of each of the frame, the connection structure, and the molding material,
wherein the metal layer is connected to a ground pattern included in at least one of the plurality of wiring layers of the frame.

2. The semiconductor package of claim 1, wherein the metal layer is connected to a ground pattern included in at least one of the one or more redistribution layers of the connection structure.

3. The semiconductor package of claim 1, wherein the frame includes a first insulating layer disposed on the first surface of the connection structure, a first wiring layer embedded in the first insulating layer and be partially contacting the first surface of the connection structure, a second wiring layer disposed on the other surface of the first insulating layer opposing one surface of the first insulating layer in which the first wiring layer is embedded, a second insulating layer disposed on the other surface of the first insulating layer opposing one surface of the first insulating layer in which the first wiring layer is embedded and covering at least portions of the second wiring layer, a third wiring layer disposed on the other surface of the second insulating layer opposing one surface of the second insulating layer in which the second wiring layer is embedded, first connection vias penetrating through the first insulating layer and electrically connecting the first and second wiring layers to each other, and second connection vias penetrating through the second insulating layer and electrically connecting the second and third wiring layers to each other.

4. The semiconductor package of claim 3, wherein each of the first to third wiring layers includes a ground pattern, and the metal layer is connected to the ground pattern of each of the first to third wiring layers.

5. The semiconductor package of claim 1, wherein the molding material covers at least portions of the second surface of the connection structure.

6. The semiconductor package of claim 1, wherein the connection structure further includes one or more insulating layers disposed on the frame and the active surface of the semiconductor chip,
the one or more redistribution layers are disposed, respectively, on the one or more insulating layers, and
an uppermost redistribution layer to which the passive components are connected among the one or more redistribution layers protrudes from a surface of an uppermost insulating layer of the one or more insulating layers.

7. The semiconductor package of claim 1, wherein the passive components include a first passive component and a second passive component having a thickness smaller than that of the first passive component.

8. The semiconductor package of claim 7, wherein the first passive component has a thickness greater than that of the semiconductor chip.

9. The semiconductor package of claim 7, wherein the first passive component is disposed outside the second passive component.

10. The semiconductor package of claim 7, wherein at least a part of the second passive component is disposed so that at least portions thereof overlap the semiconductor chip on a plane.

11. The semiconductor package of claim 1, wherein the encapsulant and the molding material include different materials.

12. The semiconductor package of claim 1, further comprising electrical connection metals disposed beneath the encapsulant and electrically connected to a lowermost wiring layer of the plurality of wiring layers.

13. The semiconductor package of claim 1, further comprising one or more metal pattern layers each including a plurality of metal patterns disposed at intervals along a contour of the frame,
wherein the metal layer is connected to the ground pattern included in at least one of the plurality of wiring layers of the frame through the metal pattern layers.

14. The semiconductor package of claim 13, wherein the plurality of metal patterns included in metal pattern layers disposed on different levels among the one or more metal pattern layers do not overlap each other in a stack direction.

15. The semiconductor package of claim 13, wherein each of the one or more metal pattern layers has a thickness greater than that of the metal layer.

16. A semiconductor package comprising:
a frame having a through-hole and including one or more wiring layers;
a semiconductor chip disposed in the through-hole and having an active surface having connection pads disposed thereon and an inactive surface opposing the active surface;
an encapsulant covering at least portions of each of the frame and the semiconductor chip and filling at least portions of the through-hole;
a connection structure disposed on the frame and the active surface of the semiconductor chip and including one or more redistribution layers electrically connected to the one or more wiring layers;
one or more passive components disposed on the connection structure and electrically connected to the one or more redistribution layers;
a molding material covering at least portions of each of the connection structure and the one or more passive components;
a metal layer covering at least portions of outer surfaces of each of the frame, the connection structure, and the molding material; and
multiple metal pattern layers each including a plurality of metal patterns disposed at intervals along a contour of any one of the frame and the connection structure,
wherein the plurality of metal patterns included in metal pattern layers disposed on different levels among the multiple metal pattern layers are disposed to be misaligned with each other in a stack direction.

17. A semiconductor package comprising:
a frame having an opening and including one or more wiring layers;
a semiconductor chip disposed in the opening and having an active surface having connection pads disposed thereon and an inactive surface opposing the active surface;
an encapsulant covering a portion of the semiconductor chip and filling a portion of the opening;
a connection structure disposed on the frame and the active surface of the semiconductor chip, and including one or more redistribution layers electrically connected to the electrode pads and the one or more the wiring layers;
a metal layer covering at least portions of outer surfaces of each of the frame and the connection structure;
first metal patterns extending between the metal layer and a first ground pattern of one of the one or more wiring layers or the one or more redistribution layers, the first metal patterns spaced apart from each other by first insulating patterns therebetween; and
second metal patterns extending between a second ground pattern of another of the one or more wiring layers or the one or more redistribution layers and the metal layer, the second metal patterns spaced apart from each other by second insulating patterns therebetween,
wherein the first metal patterns and the second metal patterns are staggered in a plan view along a stacking direction of the connection structure and the semiconductor chip.

18. The semiconductor package of claim 17, wherein the first metal patterns respectively overlap the second insulating patterns in the plan view along the stacking direction, and
the second metal patterns respectively overlap the first insulating patterns in the plan view along the stacking direction.

19. The semiconductor package of claim 17, wherein the first metal patterns respectively, completely overlap the second insulating patterns in the plan view along the stacking direction, and
the second metal patterns respectively, completely overlap the first insulating patterns in the plan view along the stacking direction.

20. The semiconductor package of claim 17, further comprising:
one or more passive components disposed on the connection structure and electrically connected to the one or more redistribution layers; and a molding material covering at least portions of each of the connection structure and the one or more passive components, wherein the metal layer covers at least portions of outer surfaces of the molding material.

* * * * *